(12) United States Patent
Bosman et al.

(10) Patent No.: US 11,170,846 B2
(45) Date of Patent: Nov. 9, 2021

(54) QUBIT APPARATUS AND A QUBIT SYSTEM

(71) Applicant: Technische Universiteit Delft, Delft (NL)

(72) Inventors: Sal Jua Bosman, Delft (NL); Gary Alexander Steele, Delft (NL)

(73) Assignee: Technische Universiteit Delft, Delft (NL)

( * ) Notice: Subject to any disclaimer, the term of this patent is extended or adjusted under 35 U.S.C. 154(b) by 19 days.

(21) Appl. No.: 16/480,713

(22) PCT Filed: Jan. 26, 2018

(86) PCT No.: PCT/NL2018/050057
§ 371 (c)(1),
(2) Date: Jul. 25, 2019

(87) PCT Pub. No.: WO2018/139928
PCT Pub. Date: Aug. 2, 2018

(65) Prior Publication Data
US 2019/0385673 A1   Dec. 19, 2019

(30) Foreign Application Priority Data

Jan. 27, 2017 (NL) .................................. 2018253

(51) Int. Cl.
| | |
|---|---|
| *G11C 11/44* | (2006.01) |
| *H01L 39/02* | (2006.01) |
| *G06N 10/00* | (2019.01) |
| *H01L 39/22* | (2006.01) |
| *H01P 7/08* | (2006.01) |

(52) U.S. Cl.
CPC .............. *G11C 11/44* (2013.01); *G06N 10/00* (2019.01); *H01L 39/025* (2013.01); *H01L 39/223* (2013.01); *H01P 7/08* (2013.01)

(58) Field of Classification Search
CPC ..... G11C 11/44; H01L 39/025; H01L 39/223; G06N 10/10; H01P 7/08
USPC ......................................................... 257/31
See application file for complete search history.

(56) References Cited

U.S. PATENT DOCUMENTS

| 10,763,420 B2 * | 9/2020 | Yoscovits ........... H01L 39/2493 |
| 2019/0296214 A1 * | 9/2019 | Yoscovits ............... H01L 39/24 |

OTHER PUBLICATIONS

Andreas Dewes: Demonstrating Quantum Speed-Up with a Two-Transmon Quantum Processor, Thesis for the Doctorat de l'Université Pierre et Marie Curie, Nov. 15, 2012 (Nov. 15, 2012), pp. 1-200, XP055227811, Retrieved from the Internet: URL:http://iramis.cea.fr/drecam/spec/Pres/Quantro/static/wp-content/uploads/2013/09/thesis_Dewes_web.pdf [retrieved on Nov. 11, 2015] Chapter 3 and 7.

(Continued)

*Primary Examiner* — Tu-Tu V Ho
(74) *Attorney, Agent, or Firm* — N.V. Nederlandsch Octrooibureau; Catherine A. Shultz; Katelyn J. Bernier (57) ABSTRACT

A transmon qubit comprising a plate capacitor comprising a first plate (202) and a second plate (203) wherein the first plate is disposed opposite to at least a part of the second plate, wherein the first plate and the second plate are connected via a nonlinear inductance element (304), and a capacitance (205) formed between the first plate and the second plate, wherein the first plate and the second plate are configured to form a vacuum gap capacitor.

20 Claims, 7 Drawing Sheets

(56) References Cited

OTHER PUBLICATIONS

Katarina Cicak et al: "Vacuum-Gap Capacitors for Low-Loss Superconducting Resonant Circuits", IEEE Transactions on Applied Superconductivity, IEEE Service Center, Los Alamitos, CA, US, vol. 19, No. 3, Jun. 2009 (Jun. 2009), pp. 948-952, XPO11262430, ISSN: 1051-8223, Section I.
David Gunnarsson et al: Paper; Dielectric losses in multi-layer Josephson junction qubits;Dielectric losses in multi-layer Josephson junction qubits, Superconductor Science and Technology, IOP Publishing, Techno House, Bristol, GB, vol. 26, No. 8, Jul. 2013 (Jul. 2013), p. 85010, XP020248278, ISSN: 0953-2048, DOI: 10.1088/0953-2048/26/8/085010; Section 4.
Adrian Parra et al: Master in Quantum Science and Technology Circuit Quantum Electrodynamics with Transmon Qubits in the Ultrastrong Coupling Regime, Sep. 15, 2016 (Sep. 15, 2016), XP055413313, Retrieved from the Internet: URL:https://addi.ehu.es/bitstream/handle/10810/18901/Master%20Thesis,%20Adrian.pdf [retrieved on Oct. 6, 2017], Chapter 3.
Ephraim Shahmoon et al: "Electronic zero-point fluctuation forces inside circuit components", arxiv.org, Cornell University Library, 201 Olin Library Cornell University Ithaca, NY 14853, Dec. 10, 2016 (Dec. 10, 2016), XP080738238, p. 3-p. 4; figure 3.
Cleland A N et al: "Superconducting qubit storage and entanglement with nanomechanical resonators", Physical Review Letters, American Physical Society, US, vol. 93, No. 7, Aug. 13, 2004 (Aug. 13, 2004), pp. 70501/1-70501/4, XP002681902, ISSN: 0031-9007, DOI: 10.1103/PHYSREVLETT.93.070501.

\* cited by examiner

QUBIT APPARATUS AND A QUBIT SYSTEM

FIELD OF THE INVENTION

The invention relates to a qubit apparatus and a qubit system, and more specifically, a transmon qubit and a transmon qubit system.

BACKGROUND OF THE INVENTION

A classical computer uses binary bits of 0 and 1 (on/off) to perform computational tasks. On the other hand a quantum computer uses the laws of quantum mechanics wherein a quantum bit can be both 0 and 1 simultaneously, using the quantum mechanical superposition principle. Such quantum processors allow to perform calculations beyond the capabilities of the best imaginable classical computers. A mayor engineering hurdle is the fact that the quantum information stored in the quantum state is very fragile to unwanted and uncontrolled environmental influences, known as decoherence. Performing quantum computation and quantum simulations on these processors require many classical control lines to manipulate, couple (entangle), transfer, and read out the quantum information stored in the quantum bit. Combining both, preventing decoherence, whilst retain enough control is challenging. Superconducting quantum circuits cooled down to miliKelvin temperatures show an exceptional good balance between coherence and accessibility for control lines, which combined with the versatility of engineering circuits using cleanroom fabrication technologies make it into a fast developing field for scalable quantum computing and simulation.

For a quantum bit (qubit) to be restricted to 0 and 1 (computational subspace), the qubit needs be an anharmonic oscillator at a single quantum of excitation, like a natural atom. One candidate for a building block of the quantum computer using superconducting circuits is a transmon qubit. The transmon qubit is a type of superconducting charge qubit designed to have reduced sensitivity to charge noise. The transmon qubit achieves its reduced sensitivity to charge noise by significantly increasing the ratio of the Josephson energy to charging energy. This is accomplished through the use of a large shunting capacitor. The result is energy level spacings that are approximately independent of offset charge. The cost of the reduced charge sensitivity is a reduced anharmonicity, but which is for the right charging energy still sufficient for the transmon to behave as a qubit, such that its excitations can be individually addressed by classical microwave control pulses.

Figure 1:
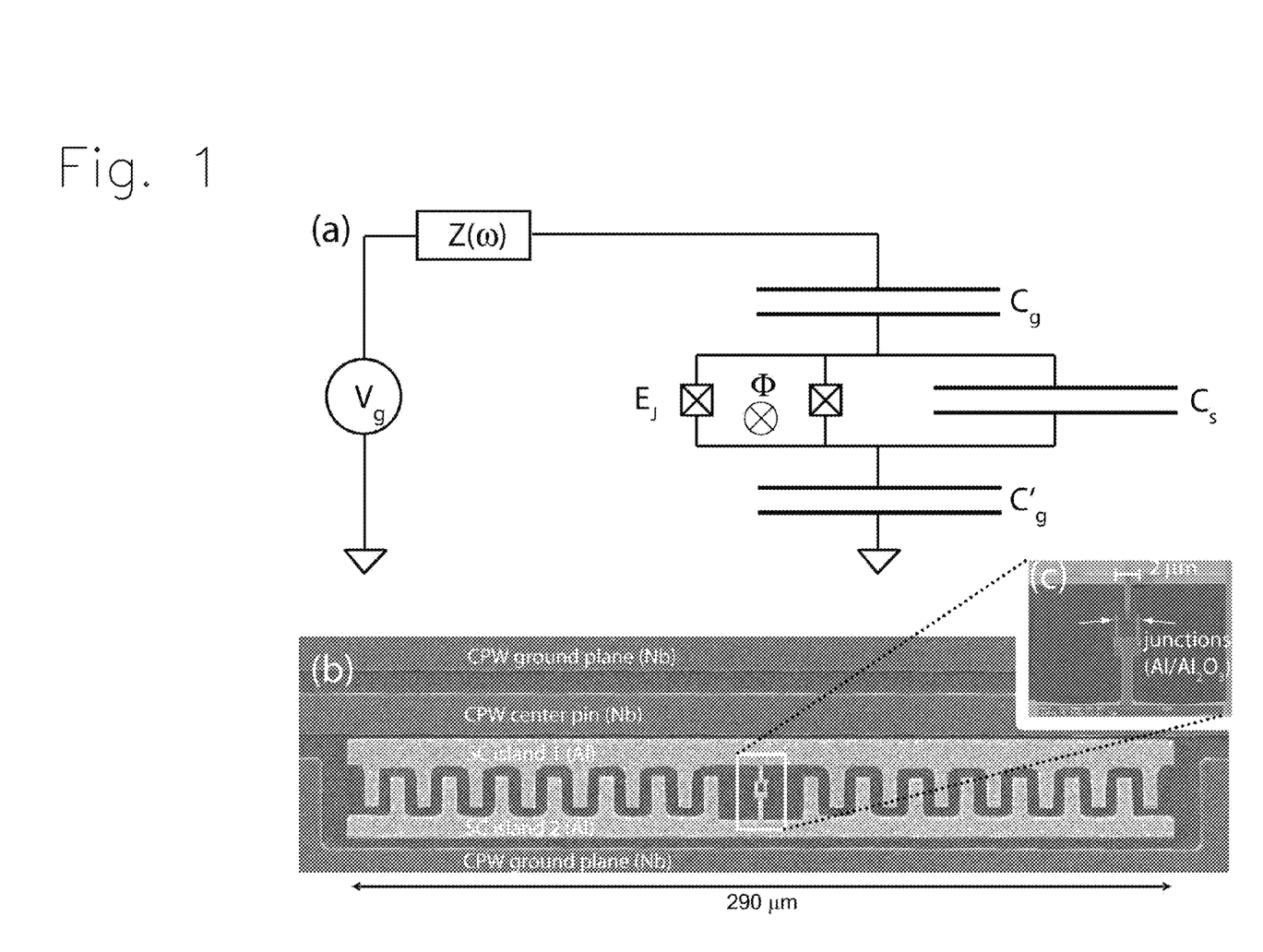
FIG. 1 schematically shows a transmon qubit system according to prior art.

FIG. 1 schematically shows a transmon qubit system according to prior art. FIG. 1a shows a circuit of the transmon qubit system according to prior art that can be identical to a circuit of a differential single Cooper pair box (CPB), consisting of two superconducting islands coupled by two Josephson junctions. The coupling to ground can be purely capacitive. The use of two Josephson junctions allows for tuning of the effective Josephson energy via an external magnetic flux penetrating the superconducting loop formed by the two Josephson junctions. The Josephson junctions provide a non-dissipative non-linear inductive element, which remains non-linear even at a single quantum excitation, such that the qubit as a whole behaves similar to a natural atom. Therefore the transmon qubit is also referred to as an artificial atom.

FIG. 1b and 1c show an optical and SEM image of a transmon qubit system according to prior art. A transmon qubit device is positioned inside a coplanar waveguide (CPW). While the size of the junctions and the superconducting loop can be very similar to CPB devices, the inter-island capacitance $C_s$ can be increased drastically due to the large size of the islands and the interdigitated finger structure (Super conducting islands 1 and 2). A large $C_s$ is needed to achieve the reduced sensitivity to charge noise. This capacitance can be matched by comparably large capacitances $C_g$ and $C'_g$ to the ground plane and center pin of a transmission line resonator, in order to remain sufficiently coupled to the microwave resonator in order to manipulate and read-out the state of the qubit by applying microwave tones and pulses to the microwave resonator. The frequency of the qubit is set by both the Josephson energy and the charge energy, which is set by the total capacitance of the qubit including its capacitive embedding within the surrounding circuit and circuit elements. The charging energy determines the anharmonicity of the qubit. This anharmonicity allows to specifically address the different excitation levels of the qubit, which is critical in quantum computing application to remain in well defined computational basis (0 and 1, or more)

The following article DOI: 10.1007/s11128-009-0100-6 provides a further background on "qubits and transmon qubits".

A drawback of this transmon qubit system according to prior art is the large size of the interdigitated finger structure (Super conducting islands 1 and 2), as a quantum computer needs multiple qubits and the interdigitated finger structure (Super conducting islands 1 and 2) is large, about 290 μm. Furthermore, it is desired to increase the coherence time of a transmon qubit.

An object of the invention therefore is to provide a transmon qubit and a transmon qubit system with a reduced size. Another object of the invention is increasing a coherence time of a transmon qubit and a transmon qubit system. Yet another object of the invention is coupling a transmon qubit state to a mechanical state for more complicated quantum computation.

SUMMARY OF THE INVENTION

According to a first aspect, the invention provides a transmon qubit comprising a plate capacitor comprising a first plate and a second plate wherein the first plate is disposed opposite to at least a part of the second plate, wherein the first plate and the second plate are connected via a nonlinear inductance element, and a capacitance formed between the first plate and the second plate; wherein the first plate and the second plate are configured to form a vacuum gap capacitor.

Advantageously, by applying the invention, the size of the transmon qubit is significantly reduced and a transmon qubit coherence time can be increased by allowing to reduce the electric fields in dielectrics. Furthermore as the fields are confined between the first and the second plate the sensitivity of the qubit to its nearby surroundings is reduced. Yet another advantage is that connecting the qubit to multiple other circuit elements, the stray coupling of these other elements can be reduced.

Advantageously, a transmon qubit coherence time can be increased because loss of coherence can be due to inferior dielectric interfaces, and vacuum has a good dielectric charge stability. The coherence time of qubits is mostly limited to dielectric losses of electric fields in dielectric volumes and electric fields through dielectric-superconductor and dielectric-vacuum interfaces. As the electric fields are solely between the two plates between a vacuum gap the exposure of the qubit to dielectrics can be reduced significantly In another embodiment, the nonlinear inductance element comprises at least one of the following devices, a Josephson junction, a superconducting quantum interference device (SQUID); a direct current superconducting quantum interference device (DC SQUID), a tunnel junction device comprising an insulator with a superconductor on each side, a superconductor-normal-superconductor junction device wherein the normal section is a Josephson junction weak link, and a superconductor-semiconductor-superconductor device comprising a superconductor proximitized nanowire or 2DEG or graphene or carbon nanotube or 1D or 2D nanomaterials. Advantageously these devices can exhibit an AC Josephson effect.

According to another aspect, the invention provides a system comprising the transmon qubit, further comprising a transmission line that is capacitively coupled to at least one of the first plate and the second plate.

Advantageously, the transmon qubit can be controlled by the transmission line or a transmission line resonator. The transmission line allows the qubit state to be manipulated and read out by applying microwave tones and pulses to the transmission line or transmission line resonator. A qubit in quantum applications requires to be coupled to various circuit elements simultaneously, like a flux line to control the qubit's frequency, a microwave drive line to excite the qubit, microwave resonator to read out the qubit state, and microwave resonators that couple two qubits together (coupling bus). Coupling all these elements to a qubit, without incurring unwanted cross-couplings is difficult, and with further size reductions gets even more difficult. As the electric fields are confined between the two plates, coupling multiple other circuit elements is easier. Especially if care is taken to shield the other circuit elements by using a ground shield (like a CPW with a cover that connects both grounds such that the transmission line (resonator) is completely isolated from the rest of the circuit.)

In an embodiment, one of the first and the second plate is connected to a circuit ground. This configuration advantageously enhances the capacitive embedding of the qubit within the circuit, thereby simplifying the engineering of the wanted capacitance matrix.

In yet another embodiment, the system further comprising a circuit ground that is capacitively coupled to at least one of the first plate and the second plate. This configuration advantageously enhances the ability to control the coupling of the qubit to various circuit elements by controlling the capacitive embedding of the qubit with the surrounding circuit.

According to another aspect, the invention provides a quantum memory comprising the transmon qubit, wherein one of the first plate and the second plate comprises a first subplate and a second subplate, and the first subplate is capacitively coupled to the second subplate, wherein the first subplate is connected to a circuit ground and connected to the nonlinear inductive element, and the second subplate is configured to receive a DC voltage, and a capacitance of a capacitive coupling between the second subplate and the other one of the first plate and the second plate is larger than a capacitance of a capacitive coupling between the first subplate and the other one of the first plate and the second plate; wherein at least one of the second subplate and the other one of the first plate and the second plate is configured to behave in an operating state as a mechanical resonator; wherein a transmon qubit resonance is coupled to a mechanical resonance of the mechanical resonator and a transmon qubit state is transferable to a mechanical state.

The quantum memory advantageously enhances the time wherein the quantum information can be stored without being lost by decoherence. Furthermore as the mechanical state is harmonic, it allows different protocols to protect the quantum information from decoherence, known as error protection. One such an example are so called cat-codes that allow the protection of quantum state information in harmonic oscillators. The quantum memory further advantageously enhances the time wherein the quantum information can be stored without being lost by decoherence. Typical coherence times of transmon qubit vary between 10-200 microseconds. Mechanical resonators typically show much longer coherence times even up to many minutes. Like in a classical computer memory is an important feature that a processor can contain, with the important difference that quantum information cannot be copied, and only transferred. This invention allows to controllably transfer the quantum state of the qubit into the mechanical state, thereby increasing the life-time of the quantum information. Furthermore as the mechanical state is harmonic, opposed to the qubits anharmonicity, it allows different error-correction and detection-protocols to protect the quantum information from decoherence not available for qubits. One such an example are so called cat-codes that allow the protection of quantum state information in harmonic oscillators.

Further embodiments are disclosed in the attached claims.

BRIEF DESCRIPTION OF THE FIGURES

Embodiments of the present invention will be described hereinafter, by way of example only, with reference to the accompanying drawings which are schematic in nature and therefore not necessarily drawn to scale. Furthermore, like reference signs in the drawings relate to like elements.

DETAILED DESCRIPTION

FIGS. 2A, 2B, 2C, 2D schematically show various transmon qubits according to the present invention. Here the transmon qubit is shown isolated without its connection to other circuit elements, such as transmission line resonators, control lines, the circuit ground. Therefore it is understood that the capacitive embedding of the transmon is omitted here.

Figure 2A:
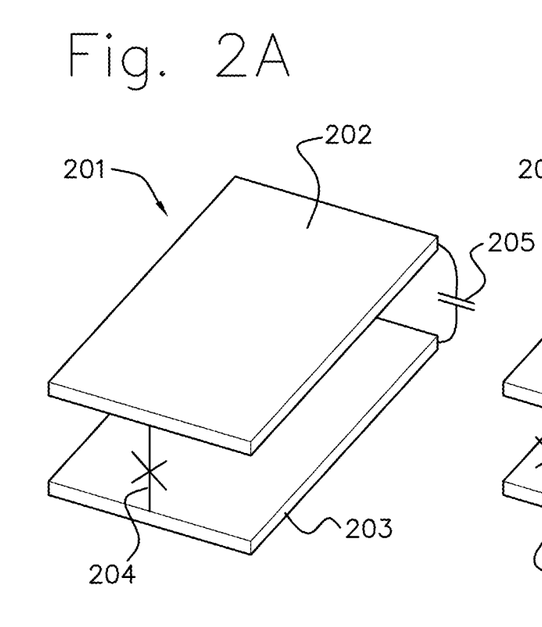
FIG. 2A schematically shows a transmon qubit according to an embodiment of the present invention.

FIG. 2A shows a transmon qubit according to an embodiment of the present invention. The transmon qubit 201 or the transmon qubit device comprises a plate capacitor comprising a first plate 202 and a second plate 203. The first plate 202 is disposed opposite to at least a part of the second plate 203. The first plate 202 and the second plate 203 are connected via a nonlinear inductance element 204. Furthermore, a capacitance 205 is formed between the first plate 202 and the second plate 203.

The first plate 202 can be disposed at a first layer, the second plate 203 can be disposed at a second layer which is not the first layer. The first plate 202 or/and the second plate 203 can also have any other shape. Optionally, at least one of the first plate 202 and the second plate 203 can be provided with a cut-out (not shown here), such as a hole of an arbitrary shape. This can improve the structural rigidness of the at least one of the first plate 202 and the second plate 203, or can improve mechanical features of the device, or can improve the quality of the transmon qubit 201. The application of holes, slits and other structures can alter the rigidity, flexibility or mechanical and capacitive properties of the transmon qubit 201. Also, the first plate 202, or/and the second plate 203 do not necessarily need to be planar, and as such can be bended or have support structures to support the first plate 202, or/and the second plate 203.

The first plate 202 can be covered fully or partly by the second plate 203, alternatively the second plate 203 can be covered fully or partly by the first plate 202. The first plate 202 can be disposed such that a main surface of the first plate 202 is, at least substantially, parallel with at least a part of a main surface of the second plate 203. The first plate 202 or/and the second plate 203 can be disposed parallel, perpendicular, or at any angle with respect to a substrate surface (not depicted in FIG. 2A).

Advantageously, the size of the transmon qubit 201 is significantly reduced compared to the interdigitated finger structure (Super conducting islands 1 and 2 of FIG. 1). Another advantage is that the electric fields of the qubit are confined into a small, well controlled volume, thereby making the requirements of the circuit surrounding less constrained, and therefore reduce the transmon qubit sensitivity to uncontrolled and unwanted environmental influences. Another advantage of the invention is an increase in coherence time of a transmon qubit and a transmon qubit system, by reducing the electric fields which are located in lossy dielectrics or other hard to control factors. A further advantage is that the connection of the qubit to other circuit elements can be simplified, without inducing unwanted and uncontrolled coupling between those elements.

The first plate 202 or/and the second plate 203 can be made from thin (approximately 10 nm-several microns thick) NbTiN. Besides NbTiN, other superconducting materials can be used as well, such as aluminium, molybdenum rhenium, niobium, niobium-titanium, indium, titanium, vanadium, a high-Tc superconductor, or a combination of superconducting materials. Also non-trivial topological superconductors can be used. The superconducting materials may comprise the abovementioned materials, but not limited to those materials. The thickness of both plates can be chosen freely within the limits of used lithography and fabrication techniques. The thickness can control the mechanical and capacitive properties of the qubit and designed for rigidity or flexurability. Also, the distance between the plates can be chosen at will, varying from 10 nm to several microns, depending determining the capacitance between the two plates, where it is understood that smaller gaps result in a smaller qubit.

The first plate 202 and the second plate 203 can be directly or indirectly connected via the nonlinear inductance element 204. When the first plate 202 is indirectly connected to the nonlinear inductance element 204, it is to be understood that the first plate 202 is firstly connected to an additional element, and the additional element is connected to the nonlinear inductance element 204. The same holds for an indirect connection between the nonlinear inductance element 204 and the second plate 203. The first plate 202 and the second plate 203 can be electrically connected, or galvanically connected via a nonlinear inductance element.

According to an embodiment, the first plate 202 and second plate 203 are configured to form a vacuum gap capacitor. Advantageously, a transmon qubit coherence time can be increased because loss of coherence can be due to inferior dielectric interfaces, and vacuum has a good dielectric charge stability. The coherence time of qubits is mostly limited to dielectric losses of electric fields in dielectric volumes and electric fields through dielectric-superconductor and dielectric-vacuum interfaces. As the electric fields are confined solely between the two plates between a vacuum gap the exposure of the qubit to dielectrics can be reduced significantly.

Figure 2B:
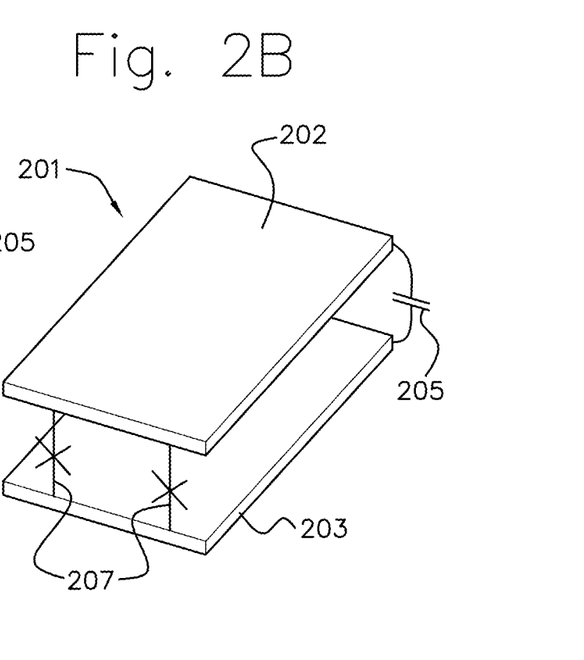
FIG. 2B schematically shows a transmon qubit according to an embodiment of the present invention.
Figure 2C:
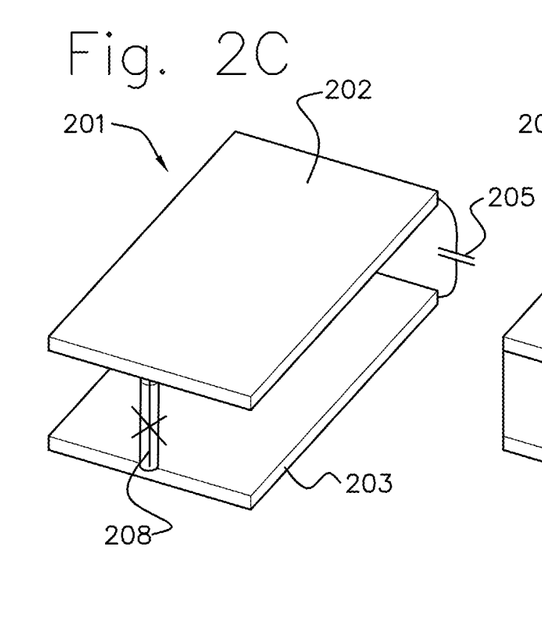
FIG. 2C schematically shows a transmon qubit according to an embodiment of the present invention.
Figure 2D:
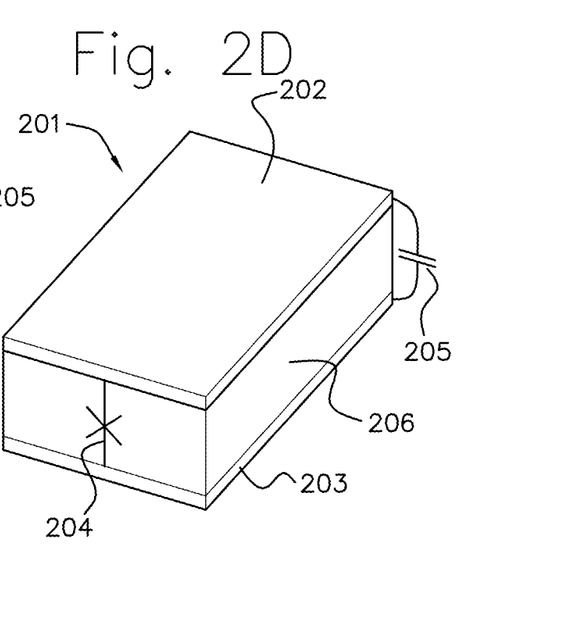
FIG. 2D schematically shows a transmon qubit according to an embodiment of the present invention.

According to an embodiment, the transmon qubit 201 can further comprise a dielectric layer 206 between the first plate 202 and the second plate 203 (see FIG. 2D). The dielectric layer 206 can be located, at least partly, between the first plate 202 and the second plate 203. The volume between the first plate 202 and the second plate 203 can be, at least partly, filled by the dielectric layer 206. An advantage of the presence of the dielectric layer 206 is that it can have a higher dielectric constant compared to that of vacuum, thus increasing the capacitance between the first plate 202 and the second plate 203. An advantage of using the dielectric layer is that the size of the qubit can even further be reduced. The properties of the dielectric layer in this embodiment are critical for the coherence time of the qubit. Another advantage of the dielectric layer between the two plates is that the fabrication can be further simplified and thereby more controlled, such that optimal material properties can be achieved, for example by allowing a fabrication fully situated in a vacuum chamber, without exposing the circuit to unwanted gasses during the fabrication of the qubit. For example a subsequent use of Atomic Layer Deposition (ALD) could provide the two plates enclosing the dielectric in a single fabrication run.

In FIG. 2A, the nonlinear inductance element 204 is a Josephson junction.

In FIG. 2B, the nonlinear inductance element 207 is a superconducting quantum interference device (SQUID) comprising two Josephson junctions in parallel, or a direct current superconducting quantum interference device (DC SQUID), thereby allowing the control of the qubit frequency by applying an external magnetic field by for example a flux-line or external field. By combining 2A and 2B further control of the qubit frequency is allowed, as the asymmetry of the DC-squid can be controlled, thereby creating controllable flux bias points where the qubit frequency is insensitive to the noise on the flux line (df/dphi). The orientation of the DC-flux loop can be equal or different than the orientation of the plates in order to allow for easy fabrication or application of magnetic flux In FIG. 2C, the nonlinear inductance element 208 is a superconductor-semiconductor-superconductor device. This device can comprise a superconductor proximitized nanowire or 2DEG or graphene or carbon nanotube or 1D or 2D nanomaterial. For examples, Boron-Nitride, Molebdynum-Disulfide (MoS2), or any other 1D or 2D (van der Waals) material.

The nonlinear inductance element can further comprise at least one of the following devices: a Josephson junction, a superconducting quantum interference device, SQUID 207; a direct current superconducting quantum interference device, DC SQUID 207, a tunnel junction device comprising an insulator with a superconductor on each side, a superconductor-normal-superconductor junction device wherein the normal section is a Josephson junction weak link, and a superconductor-semiconductor-superconductor device 208 comprising a superconductor proximitized nanowire or 2DEG or graphene or carbon nanotube or 1D or 2D nanomaterial.

For FIGS. 2A-2C, and also other transmon qubit according to the present invention, the transmon qubit can further comprise a dielectric layer 206 between the first plate 202 and the second plate 203.

Figure 2E:
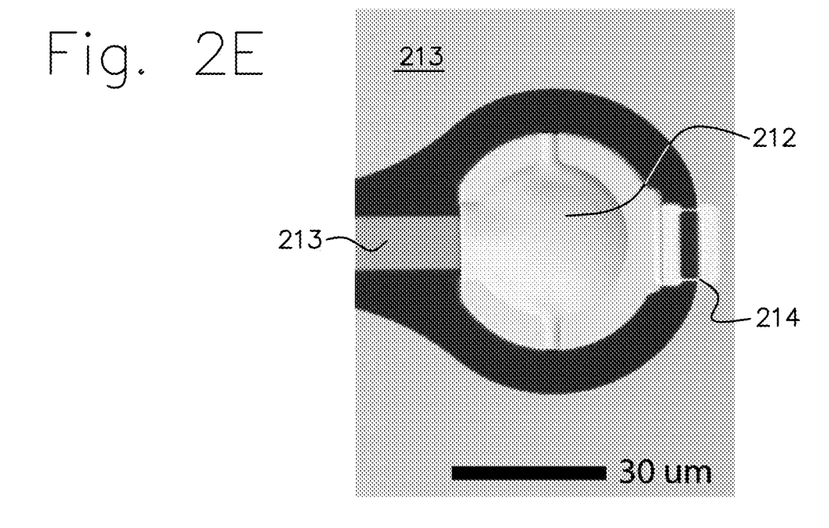
FIG. 2E schematically shows a transmon qubit according to an embodiment of the present invention.

FIG. 2E schematically shows a transmon qubit according to an embodiment of the present invention. FIG. 2E is a SEM top view of the transmon qubit comprising a first plate 212, a second plate 213. The first plate 212 is disposed opposite, in this case above, at least a part of the second plate 213. The first plate 212 and the second plate 213 are connected via a nonlinear inductor element 214. FIG. 2E shows that the transmon qubit is about 30 µm in diameter, advantageously smaller than the interdigitated finger structure (Super conducting islands 1 and 2) of FIG. 1. FIG. 2E shows that the plates are not necessarily planar and can be augmented with support structures, planes, pillars, or be bended. This allows for easy fabrication, structural and mechanical support, and obtaining the proper capacitive properties.

In an embodiment, at least one of the first plate 202 and the second plate 203 can be provided with a cut-out, such as a hole of an arbitrary shape. This can improve the structural rigidity of the at least one of the first plate and the second plate, or can improve mechanical features of the device, or can improve the quality of the transmon qubit.

Figure 3A:
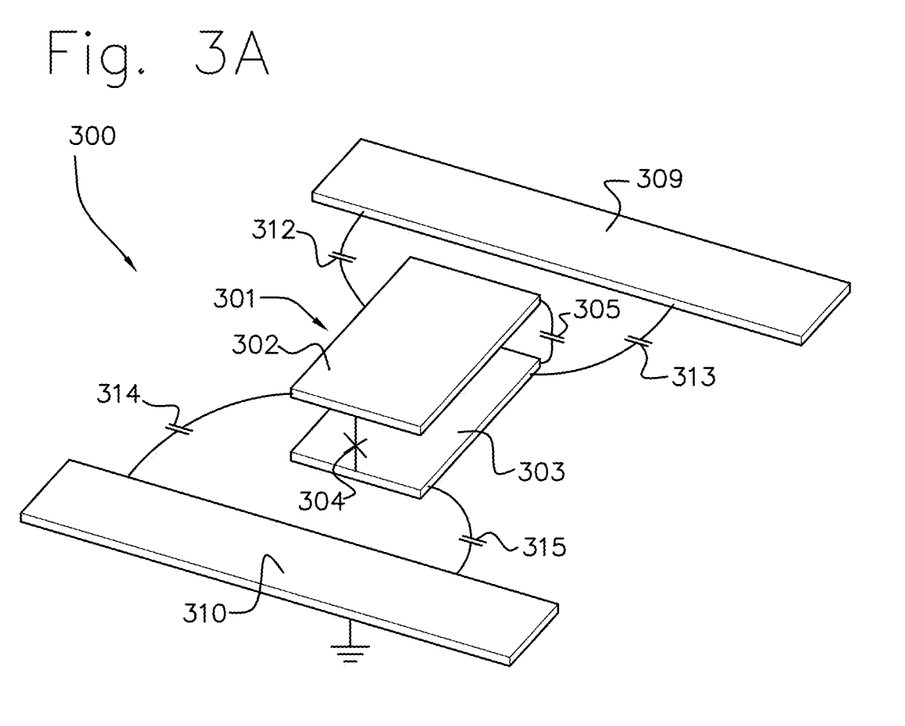
FIG. 3A schematically shows a transmon qubit system according to an embodiment of the present invention.

FIG. 3A schematically shows a transmon qubit system 300 according to an embodiment of the present invention.

The system 300 of FIG. 3A comprises a transmon qubit similar to the one of FIG. 2A. The transmon qubit depicted in at least one of FIGS. 2B, 2C, 2D can also applied here. The system further comprises a transmission line 309. The transmission line 309 can be capacitively coupled to at least one of the first plate 302 and the second plate 303. The transmission line 309 can be capacitively coupled to the first plate 302 with a first capacitance 312. The transmission line 309 can be capacitively coupled to the second plate 303 with a second capacitance 313. Due to the shape or/and position of the elements, the first capacitance 312 can be different from the second capacitance 313. The capacitive embedding of the transmon with respect to the circuit ground, and the transmission line determines the strength of the coupling of the qubit to the transmission line. Specifically, the coupling can be determined by evaluating the voltage across the non-linear inductive elements, due to an application of voltage on the transmission line, using the capacitance matrix, which is determined by the capacitive embedded of the transmon qubit in its circuit surrounding.

According to an embodiment the capacitance 305 formed between the first plate 302 and the second plate 303 can be larger than the first capacitance 312, or/and the second capacitance 313, or a sum of the first capacitance 312 and the second capacitance 313. The transmission line 309 can be a transmission line resonator. The transmission line resonator enables read out, transfer, and manipulation of the qubit state within the circuit.

The system 300 of FIG. 3A further comprises a circuit ground 310. The circuit ground 310 can be capacitively coupled to at least one of the first plate 302 and the second plate 303. The circuit ground 310 can be capacitively coupled to the first plate 302 with a third capacitance 314. The circuit ground 310 can be capacitively coupled to the second plate 303 with a fourth capacitance 315. Due to the shape or/and position of the elements, the third capacitance 314 can be different from the fourth capacitance 315.

According to an embodiment, the capacitance 305 formed between the first plate 302 and the second plate 303 can be larger than the third capacitance 314, or/and the fourth capacitance 315, or a sum of the third capacitance 314 and the fourth capacitance 315. According to an embodiment, the capacitance 305 formed between the first plate 302 and the second plate 303 can larger than the first capacitance 312, or/and the second capacitance 313, or/and the third capacitance 314, or/and the fourth capacitance 315, or a sum of these capacitances. This configuration advantageously enhances the control of the coupling of the qubit to the transmission line or transmission line resonator by engineering the various capacitances. Optionally, the circuit ground 310 can be a transmission line.

Figure 3B:
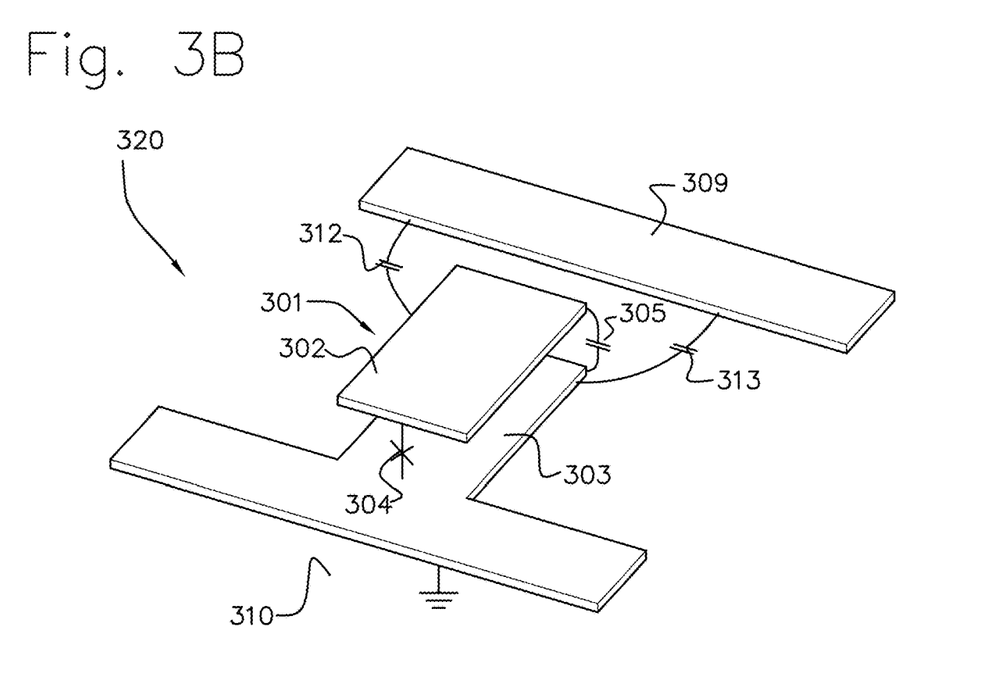
FIG. 3B schematically shows a transmon qubit system according to an embodiment of the present invention.

FIG. 3B schematically shows a transmon qubit system 320 according to an embodiment of the present invention. The system 320 is similar to the system 300 of FIG. 3A except that the second plate 303 is connected to the circuit ground 310. This configuration advantageously enhances the simplicity of the capacitive embedding of the transmon qubit, and therefore controllably engineering its coupling to other circuit elements, such as a transmission line resonator.

Figure 3C:
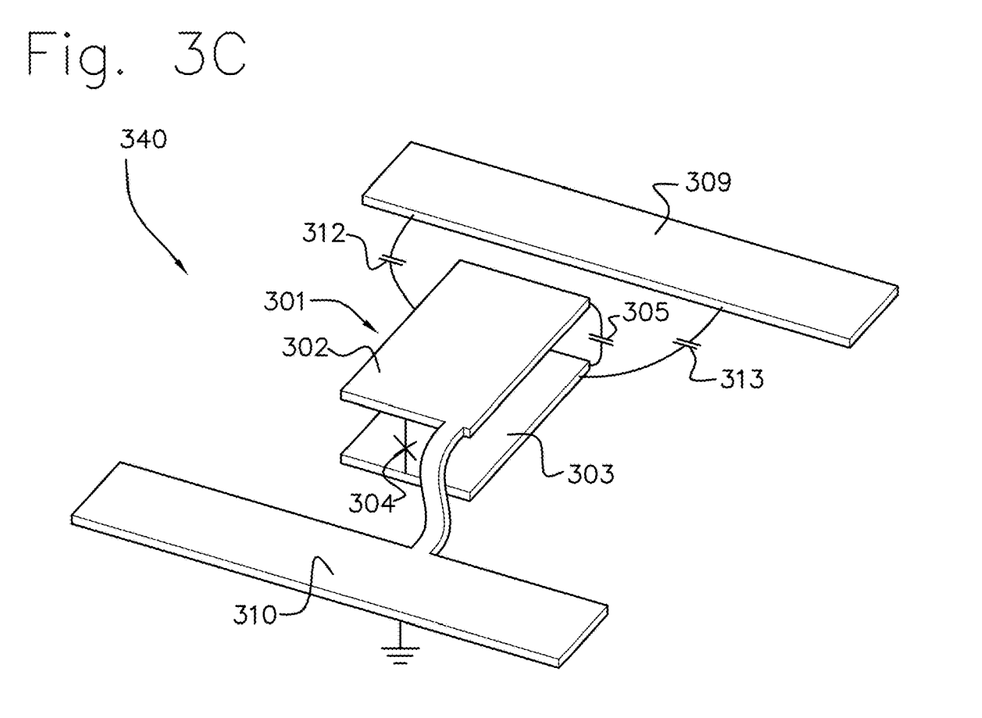
FIG. 3C schematically shows a transmon qubit system according to an embodiment of the present invention.

FIG. 3C schematically shows a transmon qubit system 340 according to an embodiment of the present invention. The system 340 is similar to the system 300 of FIG. 3A except that the first plate 302 is connected to the circuit ground 310. This configuration advantageously enhances the simplicity of the capacitive embedding similar to 3B.

Figure 4:
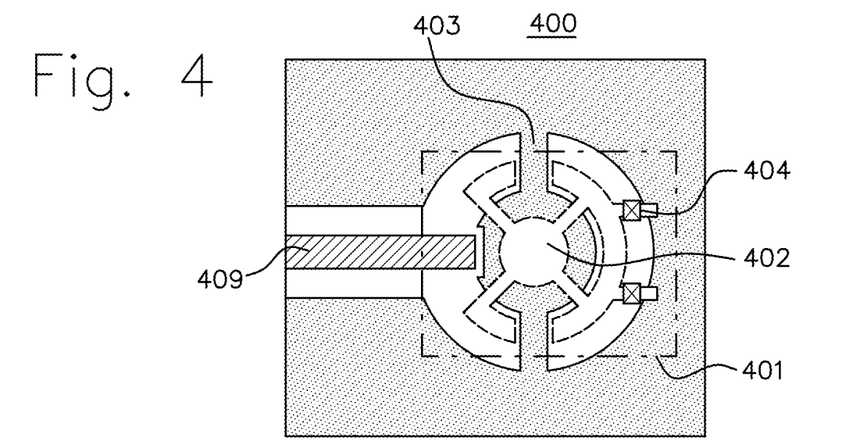
FIG. 4 schematically shows a transmon qubit system according to an embodiment of the present invention.

FIG. 4 schematically shows a transmon qubit system 400 according to an embodiment of the present invention. FIG. 4 schematically shows a top view of the system 400 comprising a transmon qubit 401. The system 400 is similar to the system 320 of FIG. 3B with a difference in the shape of the elements. In FIG. 4 the first plate 402 corresponds to the dashed area in the center of the picture. The second plate together with the circuit ground are denoted by 403. A part of the first plate 402 is on top of part of the second plate 403. The first plate 402 and the second plate 403 are connected via a nonlinear inductance element 404. In FIG. 4, the nonlinear inductance element 404 comprises two Josephson junctions, forming a superconducting quantum interference device (SQUID). FIG. 4 further shows a transmission line 409. As depicted in FIG. 4, the transmission line 409 is a transmission line resonator 409. According to an embodiment, at least one of the first plate 402 and the second plate 403 is located at or near an anti-node of the transmission line resonator 409. This configuration advantageously enhances the coupling between the transmon qubit 401 and the transmission line resonator 409, and demonstrates that the plates not necessarily are planar, as the top plate here is supported by structures that are located in the layer of the other plane.

According to an embodiment, the transmission line 409 comprises at least one of a flux bias line; a readout resonator; coupling bus; an open transmission line; a microwave drive line; and a DC gate electrode.

Figure 5:
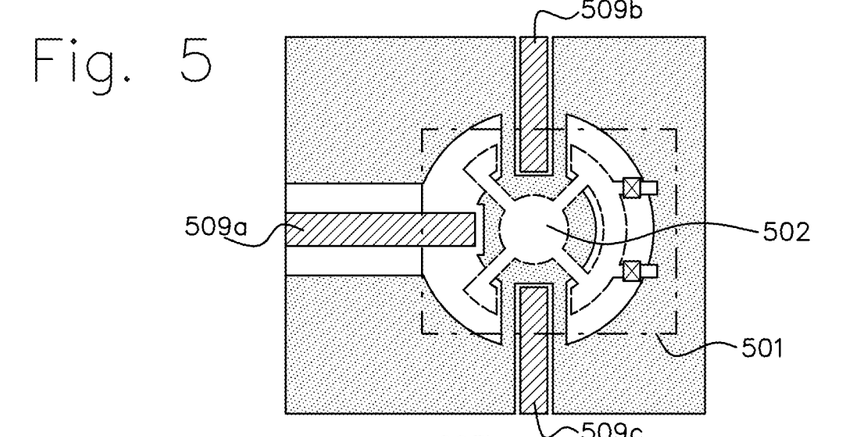
FIG. 5 schematically shows a transmon qubit system according to an embodiment of the present invention.

FIG. 5 schematically shows a transmon qubit system 500 according to an embodiment of the present invention. FIG. 5 schematically shows a top view of the system 500 comprising a transmon qubit 501. The system 500 is similar to the system 400 of FIG. 4 with a difference that the qubit 501 is coupled to multiple transmission lines 509a, 509b, 509c. As depicted in FIG. 5, the transmission lines 509a, 509b, 509c are transmission line resonator 509a, 509b, 509c. According to an embodiment, the transmission lines 509a, 509b, 509c comprise at least one of a flux bias line; a readout resonator; coupling bus; an open transmission line; a microwave drive line; and a DC gate electrode. The transmission line allows the qubit state to be manipulated and read out by applying microwave tones and pulses to the transmission line or transmission line resonator. A qubit in quantum applications requires to be coupled to various circuit elements simultaneously, like a flux line to control the qubit's frequency, a microwave drive line to excite the qubit, microwave resonator to read out the qubit state, and microwave resonators that couple two qubits together (coupling bus). Coupling all these elements to a qubit, without incurring unwanted cross-couplings is difficult, and with further size reductions this gets even more difficult. As the electric fields are confined between the two plates, coupling multiple other circuit elements is easier. Especially if specially care is taken to shield the other circuit elements by using a ground shield (like a CPW with a cover that connects both grounds such that the transmission line (resonator) is completely isolated from the rest of the circuit.)

Figure 6A:
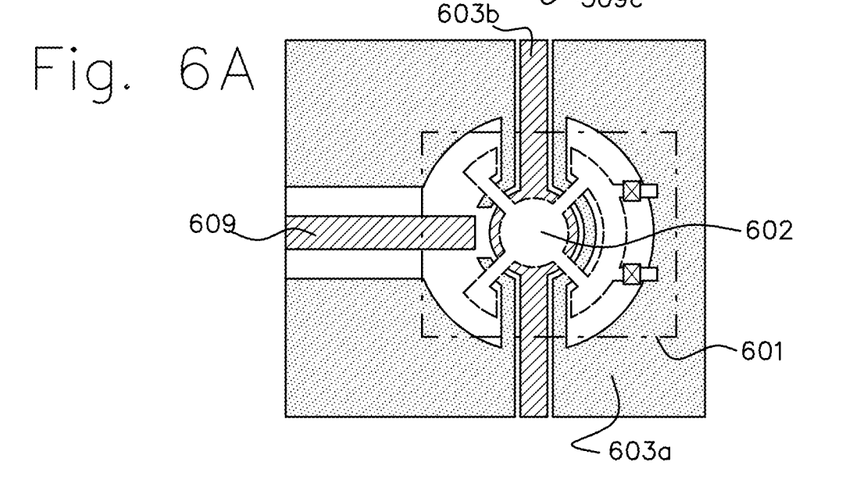
FIG. 6a schematically shows a top view of a transmon qubit system according to an embodiment of the present invention.
Figure 6B:
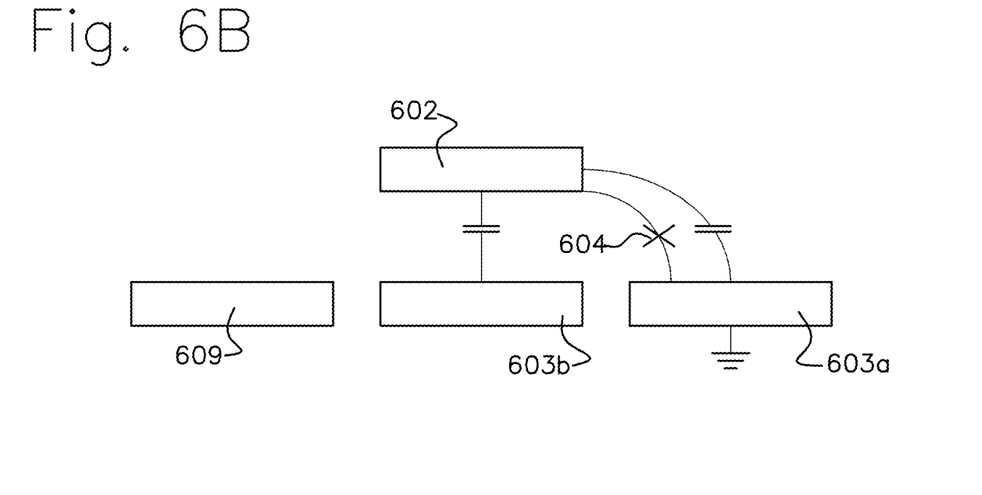
FIG. 6b schematically shows a side view of a transmon qubit system according to an embodiment of the present invention.

FIGS. 6a and 6b schematically show a quantum memory 600 according to an embodiment of the present invention. FIG. 6a schematically shows a top view of the system 600 comprising a transmon qubit 601. FIG. 6 is similar to the system 400 of FIG. 4 with a difference that the second plate 603 comprises two subplates: a first subplate 603a and a second subplate 603b. The first subplate 603a is capacitively coupled to the second subplate 603b. The first subplate 603a is connected to a circuit ground and connected to the nonlinear inductive element 604. The second subplate 603b can be configured to receive a DC voltage. A capacitance of a capacitive coupling between the second subplate 603b and the first plate 602 is larger than a capacitance of a capacitive coupling between the first subplate 603a and the first plate 602. In an embodiment, at least one of the first subplate 603a and the second subplate 603b of the one of the first plate 602 and the second plate 603 (in FIG. 6a it is the second plate 603) is disposed to at least a part of the other one of the first plate 602 and the second plate 603 (in FIG. 6a it is the first plate 602). In an embodiment, at least one of the second subplate 603b and the other one of the first plate 602 and the second plate 603 (in FIG. 6a it is the first plate 602) is configured to behave in an operating state as a mechanical resonator. In an embodiment, a transmon qubit resonance is coupled to a mechanical resonance of the mechanical resonator and a transmon qubit state is transferable to a mechanical state. FIG. 6a further shows a transmission line 609 similar to the transmission lines 509, 409 of FIGS. 4, 5.

In FIG. 6a, the second subplate 603b can act as a tuning element configured to adjust the capacitance between the first plate 602 and the second plate 603, and a frequency of the transmon qubit 601. More specifically, the second subplate 603b can act as a tuning element configured to adjust the capacitance between the first plate 602 and the second subplate 603b. In an embodiment, a tuning element 603b, 609, that can be coupled to the transmon qubit 601, is configured to adjust the capacitance between the first plate 602 and the second plate 603, and a frequency of the transmon qubit 601.

In an embodiment, the tuning element 609 is a transmission line coupled to one of the first plate 602 and the second plate 603 and configured to change a distance between the first plate 602 and the second plate 603, or a dielectric constant of the plate capacitor via a capacitive coupling.

With using a DC-gate voltage to supply a static voltage between the two plates, which are separated by a vacuum-gap, one can change the qubit capacitance, thereby changing its frequency. Being able to tune the gap between the two plates is advantages as it removes the necessity to use a DC-Squid and accompanying flux-line or magnetic field to be able to tune the qubit's frequency. One advantage is that distributing a voltage on separate gates is much easier than distributing currents over multiple lines, without incurring unwanted cross-couplings or cross-talk. This holds especially through for using fast pulses to change the qubit frequency in a short time interval. This would enable the possibility to simplify the frequency tunability interconnects in arrays of transmons used in for example surface code quantum computing architectures. Another advantage is that the capacitive environment of a DC gate can be controlled carefully, thereby confining its resulting electric fields. Magnetic fields emanating from flowing currents on a chip are naturally more extended and therefore more likely to create cross-coupling and cross-talks to various other circuit elements.

A different way to tune the qubit frequency is to use a dielectric between the separated plates as displayed in FIG. 2D. If a dielectric is used which dielectric constant depends for example on a supplied DC gate Voltage, for example as the material Strontium Titanium-Oxide (STO), the capacitance between the two plates is changed, thereby tuning the qubit's frequency. Also this method avoids the necessity of a DC-squid to make the transmon's frequency tunable.

Like in a classical processor temporary memory storage like in Random Access Memory (RAM) is an important element in a quantum processor. One important difference however is that according to the laws of quantum mechanics no quantum information can copied, thereby making only quantum information transfer possible. However as the coherence times of transmon qubit typically vary between 20-100 microseconds, a means to store temporarily quantum states is important. For example in establishing remote connection through a quantum information channel or link, a quantum bit that needs to be transferred, should be stored securely until entanglement across the quantum information channel is established, before the quantum bit can be transferred over the link. The disclosed invention allows such a feature by coupling the transmon resonance to a mechanical resonator, which can be formed by one or both of the plates being allowed to move, thereby forming a mechanical resonance, which is typically between 2-200 MHz. Such mechanical resonators typically have excellent coherence times sometimes up to many minutes (10 minutes). A requirement to transfer the quantum state of the transmon to the mechanical resonator requires a strong coupling between the transmon and the mechanical resonator. This is achieved by applying a DC-gate voltage between the two plates. This results in the effect that the gate voltage on the transmon is modulated by the mechanical resonance frequency, thereby coupling the mechanical resonator the transmon. If sufficiently strong the transition frequencies of the transmon qubit, its spectrum, will display a splitting according to phonon-number, also known as Fock states. This number splitting is well established between transmon qubits and microwave resonators and allows different methods of transferring quantum information from the transmon qubit to the resonator. One example is using phonon or photon-number selective qubit pulses, which change the state of the qubit depending on the state of the resonator, well known from ion-trap experiments and superconducting circuit experiments. Another example to transfer the qubit state to the state of the mechanical resonator is using large super position states of the mechanical resonator known as Schrodinger cat states (Science 342, 607 (2013)). By using microwave pulses the state of the qubit is transferred to the mechanical resonator, by creating even or odd Schrodinger cat states.

One advantage of the disclosed invention compared to the aforementioned prior art is that in this embodiment the coupling between the transmon qubit and the mechanical resonator can be tuned on and off by changing the DC-gate voltage. Thereby it is possible to completely separate the quantum memory from its qubit, avoiding unwanted spurious non-linearity in the mechanical resonator by the coupled transmon qubit. In the aforementioned prior art this spurious non-linearity has to be actively counter acted using microwave pulses that remove the effects from this non-linearity (known as SNAP pulses).

FIG. 6b schematically shows a side view of the system 600.

Figure 7:
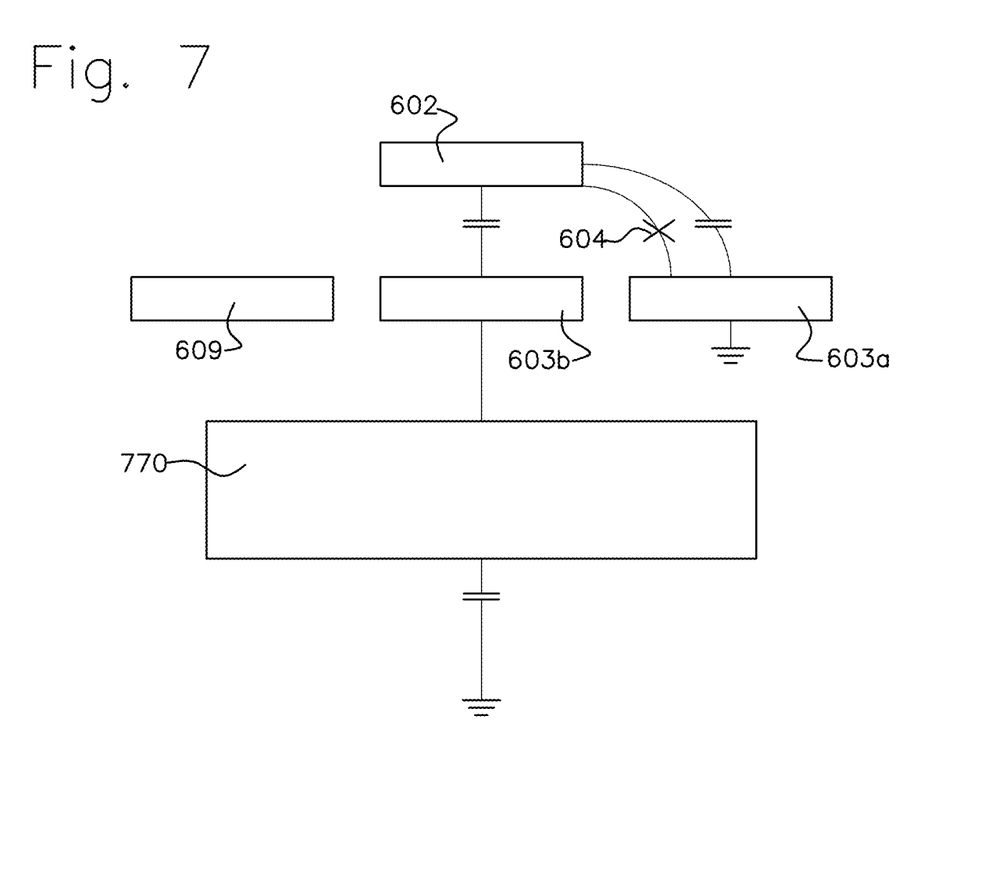
FIG. 7 schematically shows a transmon qubit system according to an embodiment of the present invention.

FIG. 7 schematically shows a quantum memory 700 according to an embodiment of the present invention. FIG. 7 schematically shows a side view of the system 700. FIG. 7 is similar to the system 600 of FIG. 6b with a difference that a reflective low pass filter 770 connected in series with a second subplate 703b, wherein a cut-off frequency of the reflective low pass filter is lower than 100 MHz.

For all the embodiments, what applies to the first plate can also apply to the second plate of the transmon qubit. The capacitance between the first plate and the second plate can be larger than any or the sum of all the capacitances between the transmon qubit and surrounding elements comprising a transmission line, a circuit ground. A transmission line can be a transmission line resonator. A transmission line comprises at least one of a flux bias line; a readout resonator; coupling bus; an open transmission line; a microwave drive line; and a DC gate electrode. A transmission line can be replaced by at least one of the following devices: a coplanar waveguide resonator comprising a central conductor and a ground plane; a halfwave coplanar waveguide resonator; a quarter wave coplanar waveguide resonator; a slot resonator; a ring resonator; a microstrip resonator; and a lumped element resonator, stripline, or other specifically transmission lines or transmission line resonator with special care taken to avoid cross coupling, such as air bridges across the CPW connecting the ground plane, or a complete cover across the CPW to avoid any unwanted spurious couplings. It is possible that such a cover across a CPW is galvanically connected to one of the plates of the qubit, if that was connected to the circuit ground. As such eliminating any unwanted stray coupling between circuit components. If an element A is connected to element B, the element A can be directly connected to the element B, or indirectly connected to the element B via element C. The element A can be electrically or galvanically connected to element B. If an element A is coupled to element B, the element A can be directly coupled to the element B, or indirectly coupled to the element B via element C. A transmission line can receive AC or/and DC signals. A transmon qubit can be a tunable transmon qubit. A circuit ground can be a AC or/and DC ground. At least one of the first plate and the second plate can be provided with a cut-out, such as a hole of an arbitrary shape. The plates in all the embodiments can be planar or non-planer, and can have support structures, pillars. A transmon qubit according to the present invention can be measured or/and controlled at cryogenic temperatures.

Figure 8:
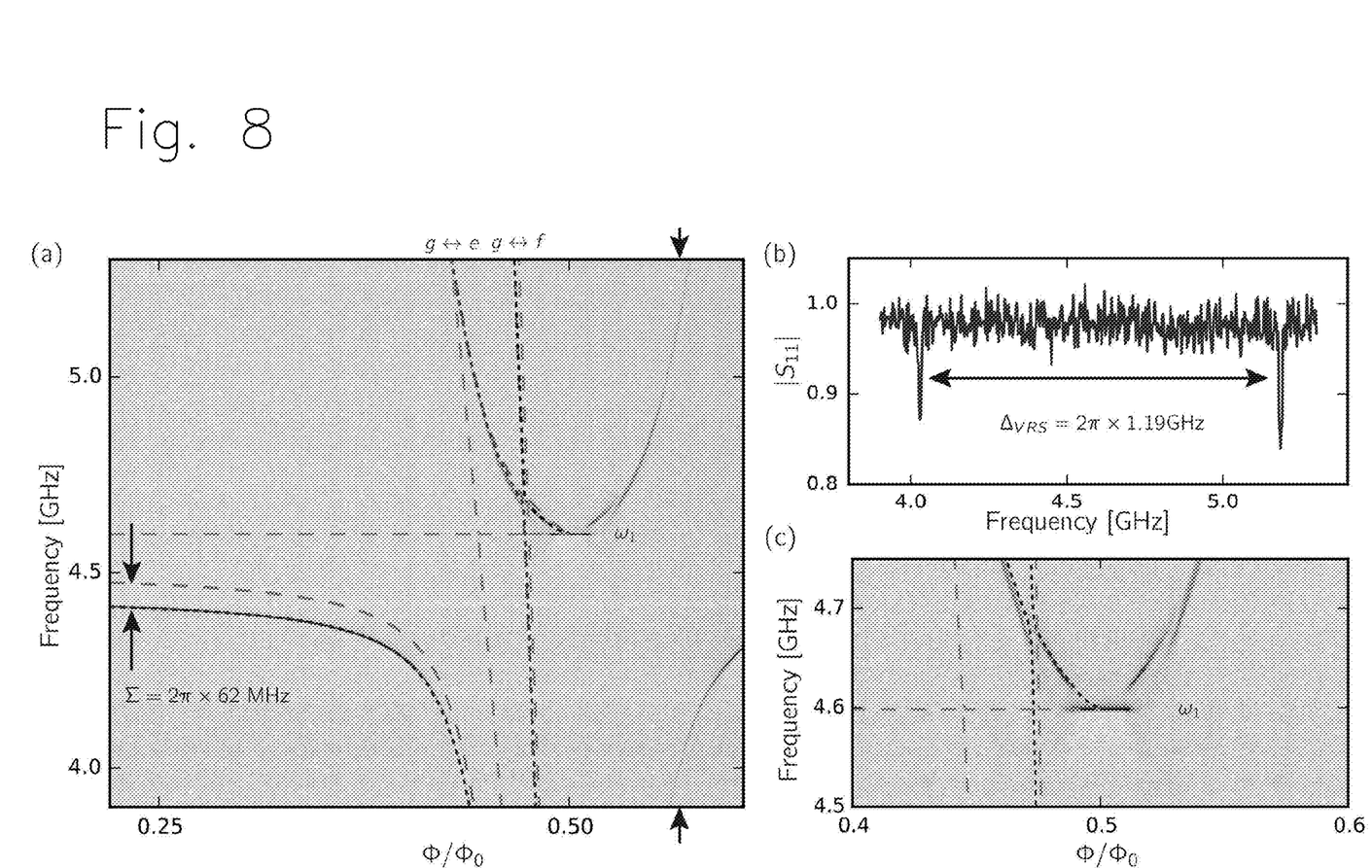
FIG. 8 shows experimental results realizing a transmon qubit.

FIG. 8 shows experimental results of the inventors realizing a transmon qubit. FIG. 8 shows a vacuum Rabi splitting. FIG. 8a shows the spectral response as a function of flux in a single-tone reflection measurement plotted as $|S_{11}|$. The blue dashed lines indicate the bare (uncoupled) cavity frequency, $\omega_1$, and the transition frequencies of the transmon from the ground state |g>, to the first |e>, and second |f> excited state. The red lines show the hybridized state transitions of the coupled system as fitted from the full spectrum. The green lines indicate the dressed state transitions using the rotating wave approximation (RWA) for the same circuit parameters. FIG. 9b shows linecut showing the vacuum Rabi splitting of the qubit transition with $\omega_1$, resulting in a separation of Delta_V RS=2pi×1.19 GHz, which is about 281 linewidth's of separation. c, Shows a close up of the spectrum around half a flux quantum (antisweet spot), where the qubit frequency is minimal. There we observe a discrete transition of the spectral response of the circuit towards the bare cavity, $\omega_1$. We suspect this signifies a decoupling of the qubit and resonator due to a thermally populated qubit. Additionally we observe a small avoided crossing with the g<–>f transition.

The present invention improves a transmon qubit system according to the prior art. A first drawback of the transmon qubit system according to the prior art is the large size of the interdigitated finger structure (Super conducting islands 1 and 2), as a quantum computer needs multiple qubits and the interdigitated finger structure (Super conducting islands 1 and 2) is large, about 290 µm. Furthermore, the electric fields of such planar defined transmon fields are allowed to stray into the dielectric substrate beneath the qubit and into the vacuum above the qubit. Therefore such qubits are sensitive to the dielectric losses of inside the dielectric volumes and dielectric interfaces wherein the electric fields are located. The present invention increases the coherence time of a transmon qubit, therefore avoiding unnecessary localization of electric fields in dielectrics.

Also due to the lack of confinement of the fields of the transmon qubit system according to the prior art, it is sensitive to unwanted stray coupling to circuit elements in it surrounding, resulting in stray coupling with other circuit elements or uncontrolled environmental influences. Yet another factor is that a single qubit typically needs to be coupled to a multitude of circuit elements, while avoiding each circuit element to be directly coupled to each other. The present invention provides a transmon qubit and a transmon qubit system with a reduced size. Furthermore the present invention confines the electric fields into a small, well controlled volume, thereby making the requirements of the circuit surrounding less constrained. Also, the invention increases a coherence time of a transmon qubit and a transmon qubit system, by reducing the electric fields which are located in lossy dielectrics or other hard to control factors. Also, the invention simplifies the connection of the qubit to other circuit elements, without inducing unwanted and uncontrolled coupling between those elements. Also, the invention couples a transmon qubit state to a mechanical state for more complicated quantum computation, and temporary storages a quantum state of the qubit in a long coherence time mechanical state. Furthermore as the mechanical state is harmonic the transfer of the qubit state into the mechanical state allows for other procedures to protect the quantum information to decoherence.

In the foregoing description of the figures, the invention has been described with reference to specific embodiments thereof. It will, however, be evident that various modifications and changes may be made thereto without departing from the scope of the invention as summarized in the attached claims.

In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the appended claims.

In particular, combinations of specific features of various aspects of the invention may be made. An aspect of the invention may be further advantageously enhanced by adding a feature that was described in relation to another aspect of the invention.

It is to be understood that the invention is limited by the annexed claims and its technical equivalents only. In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

The invention claimed is:

1. A transmon qubit comprising:
 plate capacitor comprising a first plate and a second plate wherein the first plate is disposed opposite to at least a part of the second plate, wherein the first plate and the second plate are connected via a nonlinear inductance element, and
 a capacitance formed between the first plate and the second plate;
 wherein the first plate and the second plate are configured to form a vacuum gap capacitor,
 wherein the formed vacuum gap capacitance is configured to predominantly confine the electric fields of the transmon qubit inside the capacitor, and
 wherein the transmon qubit further comprises a mechanical support element configured to receive at least one of the first plate and the second plate.

2. The transmon qubit according to claim 1, wherein the nonlinear inductance element comprises at least one of the following devices:
 a Josephson junction,
 a superconducting quantum interference device, SQUID;
 a direct current superconducting quantum interference device, DC SQUID,
 a tunnel junction device comprising an insulator with a superconductor on each side,
 a superconductor-normal-superconductor junction device wherein the normal section is a Josephson junction weak link, and
 a superconductor-semiconductor-superconductor device comprising a superconductor proximitized nanowire or 2DEG or graphene or carbon nanotube or 1D or 2D nanomaterial.

3. The transmon qubit according to claim 1, wherein at least one of the first plate and the second plate is provided with a cut-out.

4. A system comprising the transmon qubit according to claim 1, further comprising a transmission line that is capacitively coupled to at least one of the first plate and the second plate.

5. The system according to claim 4, wherein the transmission line is capacitively coupled to the first plate with a first capacitance and capacitively coupled to the second plate with a second capacitance, wherein the first capacitance is different from the second capacitance.

6. The system according to claim 5, wherein the capacitance formed between the first plate and the second plate is larger than the first capacitance, or/and the second capacitance.

7. The system according to claim 4, wherein one of the first and the second plate is connected to a circuit ground.

8. The system according to claim 5, further comprising a circuit ground that is capacitively coupled to at least one of the first plate and the second plate.

9. The system according to claim 8, wherein the circuit ground is capacitively coupled to the first plate with a third capacitance and capacitively coupled to the second plate with a fourth capacitance, wherein the third capacitance is different from the fourth capacitance.

10. The system according to claim 9, wherein the capacitance formed between the first plate and the second plate is larger than the first capacitance, or/and the second capacitance, or/and the third capacitance, or/and the fourth capacitance.

11. The system according to claim 4, wherein the transmission line is a transmission line resonator.

12. The system according to claim 11, wherein at least one of the first plate and the second plate is located at or near an anti-node of the transmission line resonator.

13. The system according to claim 4, wherein the transmission line comprises one of:
 a flux bias line;
 a readout resonator; coupling bus;
 an open transmission line;
 a microwave drive line; and
 a DC gate electrode.

14. The system according to claim 4, further comprising: a second transmission line coupled to the first and the second plate.

15. The system according to claim 14, wherein the second transmission line comprises one of:
 a flux bias line;
 a readout resonator; coupling bus;
 an open transmission line;
 a microwave drive line; and
 a DC gate electrode.

16. The system according to claim 4, further comprising: a tuning element configured to adjust the capacitance between the first plate and the second plate, and a frequency of the transmon qubit.

17. The system according to claim 16, wherein the tuning element is a transmission line coupled to one of the first plate and the second plate and configured to change a distance between the first plate and the second plate via a capacitive coupling, or a dielectric constant of the plate capacitor via a capacitive coupling.

18. The system according to claim 4, wherein the transmission line is replaced by at least one of the following devices:
   a coplanar waveguide resonator comprising a central conductor and a ground plane;
   a halfwave coplanar waveguide resonator;
   a quarter wave coplanar waveguide resonator;
   a slot resonator;
   a ring resonator;
   a microstrip resonator;
   a lumped element resonator;
   an arbitrary wave coplanar waveguide resonator;
   a stripline resonator; and
   a coplanar waveguide resonator, covered by a conductive cover connected to a circuit ground.

19. A quantum memory comprising the transmon qubit according to claim 1, wherein one of the first plate and the second plate comprises a first subplate and a second subplate, and the first subplate is capacitively coupled to the second subplate,
   wherein the first subplate is connected to a circuit ground and connected to the nonlinear inductive element, and
   the second subplate is configured to receive a DC voltage, and an associated capacitance of a capacitive coupling between the second subplate and the other one of the first plate and the second plate is larger than an associated capacitance of a capacitive coupling between the first subplate and the other one of the first plate and the second plate;
   wherein at least one of the second subplate and the other one of the first plate and the second plate is configured to behave in an operating state as a mechanical resonator;
   wherein a transmon qubit resonance is coupled to a mechanical resonance of the mechanical resonator and a transmon qubit state is transferable from the transmon qubit state to a mechanical state.

20. The quantum memory according to claim 19, further comprising a reflective low pass filter connected in series with the second subplate, wherein a cutoff frequency of the reflective low pass filter is lower than 100 MHz.

* * * * *